United States Patent
Porat et al.

(10) Patent No.: US 7,275,201 B1
(45) Date of Patent: Sep. 25, 2007

(54) MEMORY SYSTEM

(75) Inventors: Ofer Porat, Westborough, MA (US); James Tryhubczak, Cumberland, RI (US); Brian K. Campbell, Cedar Park, TX (US); Clayton A. Curry, Waltham, MA (US)

(73) Assignee: EMC Corporation, Hopkinton, MA (US)

( * ) Notice: Subject to any disclaimer, the term of this patent is extended or adjusted under 35 U.S.C. 154(b) by 387 days.

(21) Appl. No.: 11/104,735

(22) Filed: Apr. 13, 2005

(51) Int. Cl.
  *H03M 13/00* (2006.01)
(52) U.S. Cl. ...................... 714/767; 714/773
(58) Field of Classification Search ............... 714/767, 714/773
  See application file for complete search history.

(56) References Cited

U.S. PATENT DOCUMENTS

| | | | | |
|---|---|---|---|---|
| 4,030,067 A | * | 6/1977 | Howell et al. | 714/758 |
| 4,564,944 A | * | 1/1986 | Arnold et al. | 714/759 |
| 6,574,746 B1 | * | 6/2003 | Wong et al. | 714/6 |
| 7,051,265 B2 | * | 5/2006 | Tsao et al. | 714/767 |
| 7,065,697 B2 | * | 6/2006 | Briggs et al. | 714/767 |
| 2003/0070133 A1 | * | 4/2003 | Bauman et al. | 714/763 |

* cited by examiner

*Primary Examiner*—Joseph D. Torres

(57) ABSTRACT

A system having memory modules for storing nibbles of a word. The nibbles include an error correction/detection code. A memory controller is response to clock pulses to produce a read command. A synchronizer is responsive to the read nibbles and an associated read strobe signal for synchronizing the read nibbles and the read strobes to the clock pulses. A detection section is responsive to the clock pulses and the read command for producing a time window representative of a time duration during which each of the read strobes is expected. The detection system is responsive to each one of the read strobes and the produced time window for producing, for each one of the read strobes, a corresponding one of a plurality of NIBBLE ERROR signals. Each one of the NIBBLE ERROR signals indicates whether the corresponding one of the read strobes is within the produced window or is absent from such window.

3 Claims, 3 Drawing Sheets

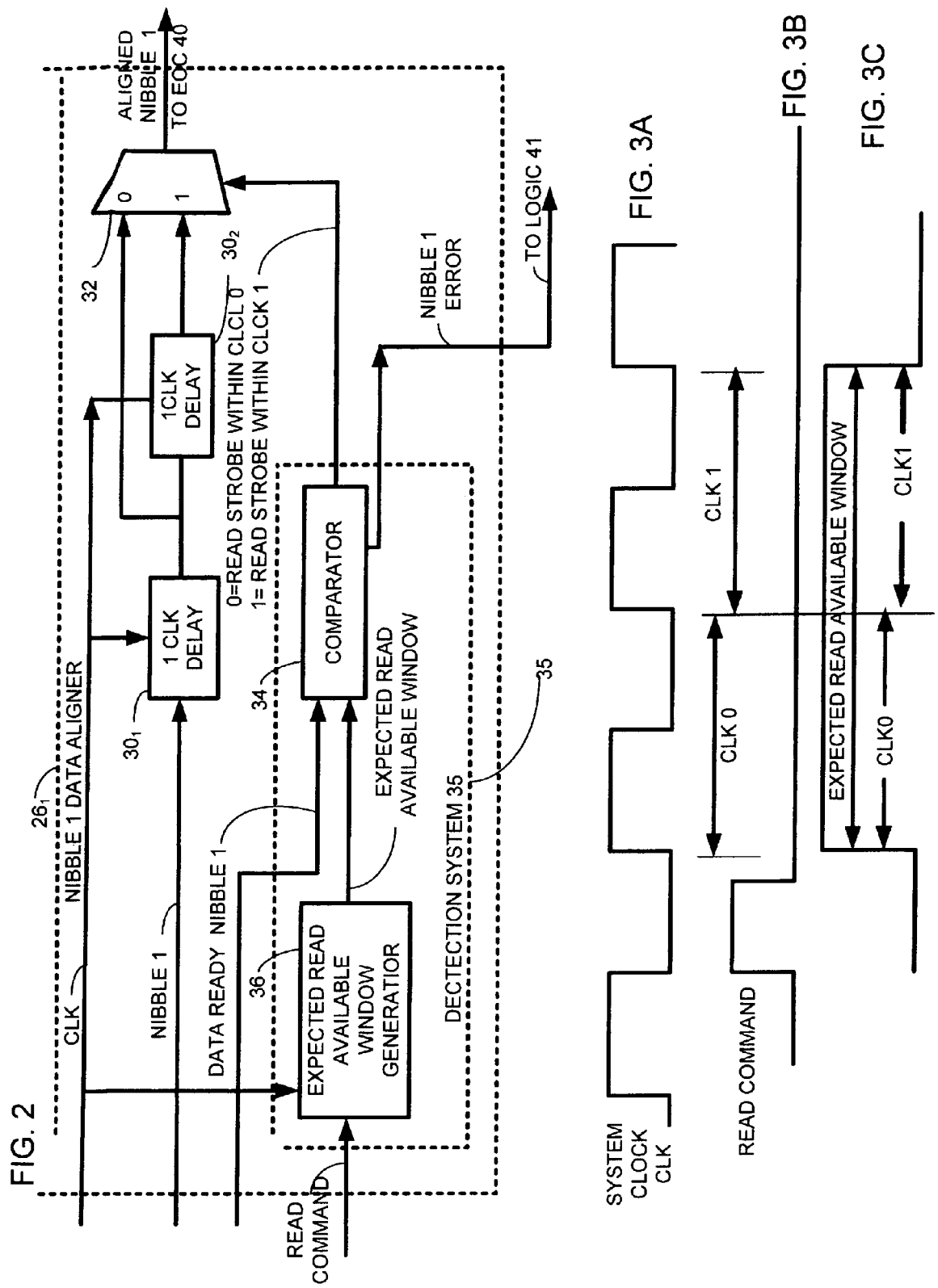

FIG. 4

| Read CMD | Nibble | Data | Read_Avail Valid on Exp CLK 0 | Read_Avail Valid on Exp CLK 1 | COMPARTOR 34 OUTPUT TO MUX 32 | Result Read Data | Nibble Error To Logic 41 | Word Error To ECC 40 |
|---|---|---|---|---|---|---|---|---|
| 1 | | | | | | | | 0 = YES |
| | 1 | A | Y | | 0 | A | 0 | |
| | 2 | B | Y | | 0 | B | 0 | |
| | 3 | C | Y | | 0 | C | 0 | |
| | 4 | D | Y | | 0 | D | 0 | |
| | 5 | E | Y | | 0 | E | 0 | |
| | 6 | F | Y | | 0 | F | 0 | |
| | m | Z | Y | | 0 | Z | 0 | |
| 2 | | | | | | | | 0 |
| | 1 | A | Y | | 0 | A | 0 | |
| | 2 | B | | Y | 1 | B | 0 | |
| | 3 | C | | Y | 1 | C | 0 | |
| | 4 | D | Y | | 0 | D | 0 | |
| | 5 | E | | Y | 0 | E | 0 | |
| | 6 | F | | Y | 0 | F | 0 | |
| | m | Z | Y | | 0 | Z | 0 | |
| 3 | | | | | | | N | 0 |
| | 1 | A | | Y | 1 | A | 0 | |
| | 2 | B | | Y | 1 | B | 0 | |
| | 3 | C | | Y | 1 | C | 0 | |
| | 4 | D | | Y | 1 | D | 0 | |
| | 5 | E | | Y | 1 | E | 0 | |
| | 6 | F | | Y | 1 | F | 0 | |
| | m | Z | | Y | 1 | Z | 0 | |
| 4 | | | | | | | | 0 |
| | 1 | A | Y | | 0 | A | 0 | |
| | 2 | x | | MISSING | DON'T CARE | x | 1 | |
| | 3 | C | Y | | 0 | C | 0 | |
| | 4 | D | Y | | 0 | D | 0 | |
| | 5 | E | Y | | 0 | E | 0 | |
| | 6 | F | Y | | 0 | F | 0 | |
| | m | Z | Y | | 0 | Z | 0 | |
| 5 | | | | | | | | 0 |
| | 1 | A | | Y | 1 | A | 0 | |
| | 2 | x | | MISSING | DON'T CARE | x | 1 | |
| | 3 | C | | Y | 1 | C | 0 | |
| | 4 | D | | Y | 1 | D | 0 | |
| | 5 | E | | Y | 1 | E | 0 | |
| | 6 | F | | Y | 1 | F | 0 | |
| | m | Z | | Y | 1 | Z | 0 | |
| 6 | | | | | | | | 1 = NOT VALID |
| | 1 | A | Y | | 0 | A | 0 | |
| | 2 | x | | MISSING | DON'T CARE | x | 1 | |
| | 3 | C | | Y | 1 | C | 0 | |
| | 4 | D | | Y | 1 | D | 0 | |
| | 5 | E | | Y | 1 | E | 0 | |
| | 6 | x | | MISSING | DON'T CARE | x | 1 | |
| | m | Z | Y | | 0 | Z | 0 | |

MEMORY SYSTEM

TECHNICAL FIELD

This invention relates generally to memory systems and more particularly to memory systems having error detection and correction.

BACKGROUND

As is known in the art, error correction and detection codes are used with data to correct errors which may occur in propagation of the data, or to at least detect the presence of an error in the propagated data. For example, a Reed-Solomon or Hamming code may be used to provide redundant bits to data. The data, with the redundant code, is fed through a portion of a system. When outputted from the system, the redundant code together with the data enables an error correction and detection (EDAC) process to reconstruct the data if one bit has been corrupted and to detect an error in the data if two bits have been corrupted. Such is sometimes known as SECDED, i.e., Single Error Correction/Double Error Detection.

As it is also known in the art, an extended EDAC is capable of correcting a nibble error (i.e., a four consecutive bit error). This is sometimes referred to in literature as "chipkill": More particularly, in a memory system with 4 data width (i.e., nibble) memory chips, if one memory chip has read therefrom corrupted data, an extended EDAC is able to detect and correct the 4 bit (nibble) error from this chip.

As is also known in the art, one application for EDAC is with memory systems. One such system is described in U.S. Pat. No. 5,853,265 entitled 'Memory Having Error Detection and Correction", inventors John K. Walton and Christopher S. MacLellan, issued Sep. 14, 1999, assigned to the same assignees as the present invention. As described therein, a memory system includes a plurality of memory packages, or modules, for storing words. Each one of the packages is adapted to store a plurality of different bits of the word. The memory system includes an error detection and correction system adapted to detect an error produced in any one of the packages in storing the digital word. The memory system has a buffer for storing a digital word having N bits of data and M redundant bits for error detection and correction. As noted above, the redundant code together with the data enables an error correction and detection (EDAC) process to reconstruct the data if one bit or one nibble has been corrupted and to detect an error in the data if two bits have been corrupted.

As is also known in the art, many memory systems include a memory controller for providing read/write commands and address signals to a memory. The memory controller and servers making the read/write data request operate in response to system clock pulses. With a Double Data Rate (DDR) memory, in responses to a read command and address signals, the data read from the memory system, the read data, along with a read strobe pulse are produced asynchronously by the memory system. A synchronizer is provided to synchronize the asynchronous read data and read strobe to the system clock. One synchronizer used with such DDR memories is sometimes referred to as a PHY, such as, for example, a 0.11μ DDR2 PHY described in "0.11μ DDR2 PHY, November 2004, Technical Review Draft Nov. 18, 2004, TECHNICAL MANUAL" Copyright © 2004 by LSI Logic Corporation. As described therein, as each nibble of a data word is read from the memory in response to a read command, a read strobe is produced. The read strobes of the nibbles are compared with a time window providing an indication of whether the read strobes are provided within the expected time window after the read command. If the read strobes from all the read nibbles are produced within the expected time window, the data is accepted; otherwise an error is indicated and no read strobe is produced. With this arrangement, if one read strobe signal is missing, then no data is available on the PHY interface and hence there is no read strobe with which to latch the read data.

SUMMARY

In accordance with the present invention, a system is provided having memory modules for storing nibbles of a word. The nibbles include an error correction/detection code. A memory controller in response to clock pulses produces a read command. A detection section is responsive to the clock pulses and the read command for producing a time window representative of a time duration during which each of the read strobes is expected. The detection system is responsive to each one of the read strobes and the produced time window for producing, for each one of the read strobes, a corresponding one of a plurality of NIBBLE ERROR signals. Each one of the NIBBLE ERROR signals indicate whether the corresponding one of the read strobes is within the produced window or is absent from such window.

Thus, in addition to producing a composite signal for all the nibbles, (i.e., a WORD ERROR signal) the system also produces a NIBBLE ERROR signal for each associated nibble. Thus, if only one read strobe is missing, resulting in its corresponding data being non-valid or corrupted, an extended EDAC algorithm can be used to correct the one nibble, therefore produce correct data.

In one embodiment, a single Data_Valid signal will be produced along with the data nibbles, even if one or more of the read strobe signals are missing. This signal Data_Valid is used to latch the data into an error detection and correction (ECC). Therefore, even if one read strobe is missing, the data will still be latched into the ECC where it is corrected.

In one embodiment, a system is provided having a memory, such memory having a plurality of memory modules. Each one of the memory modules has a plurality of memory chips. Each one of the chips stores a corresponding one of a plurality of nibbles of a word stored in such memory module. The nibbles include an error correction and detection code. The system includes a memory controller operating in response to clock pulses, for producing a read command and memory module select signal to the plurality of memory modules to thereby select for reading from, the memory the nibbles of a selected one of the memory modules. The system includes a synchronizer, responsive to the nibbles read from the selected one of the memory modules and an associated read strobe signal produced by each one of the read nibbles and for synchronizing the read nibbles and the associated read strobes to the clock pulses. The system includes an expected read strobe window detection section, responsive to the clock pulses and the read command for producing a time window representative of a time duration during which each of the read strobes is expected and such detection system is responsive to each one of the read strobes and the produced time window for producing, for one of the read strobes, a corresponding one of a plurality of NIBBLE ERROR signals. Each one of the NIBBLE ERROR signals indicates whether the corresponding one of the synchronized read strobes is within the produced window or is absent from such window. The system includes an error corrector and detector, response to each one of the produced NIBBLE ERROR signals, for correcting the word if only one of the NIBBLE ERROR signals indicates the read strobe is absent from the window and for indicating that the word has an error if more than one of the NIBBLE ERROR signals indicates the read strobe are absent from the window.

The details of one or more embodiments of the invention are set forth in the accompanying drawings and the description below. Other features, objects, and advantages of the invention will be apparent from the description and drawings, and from the claims.

DESCRIPTION OF DRAWINGS

FIG. 2 is a block diagram of an exemplary one of a plurality of aligner sections used in the memory system of FIG. 1;

FIGS. 3A-3C are timing diagrams useful in understanding the aligner section used in an aligner of the memory system of FIG. 2; and FIG. 4 is a table showing operation of the aligner used in the memory system of FIG. 1 in executing various examples.

Like reference symbols in the various drawings indicate like elements.

DETAILED DESCRIPTION

Figure 1:
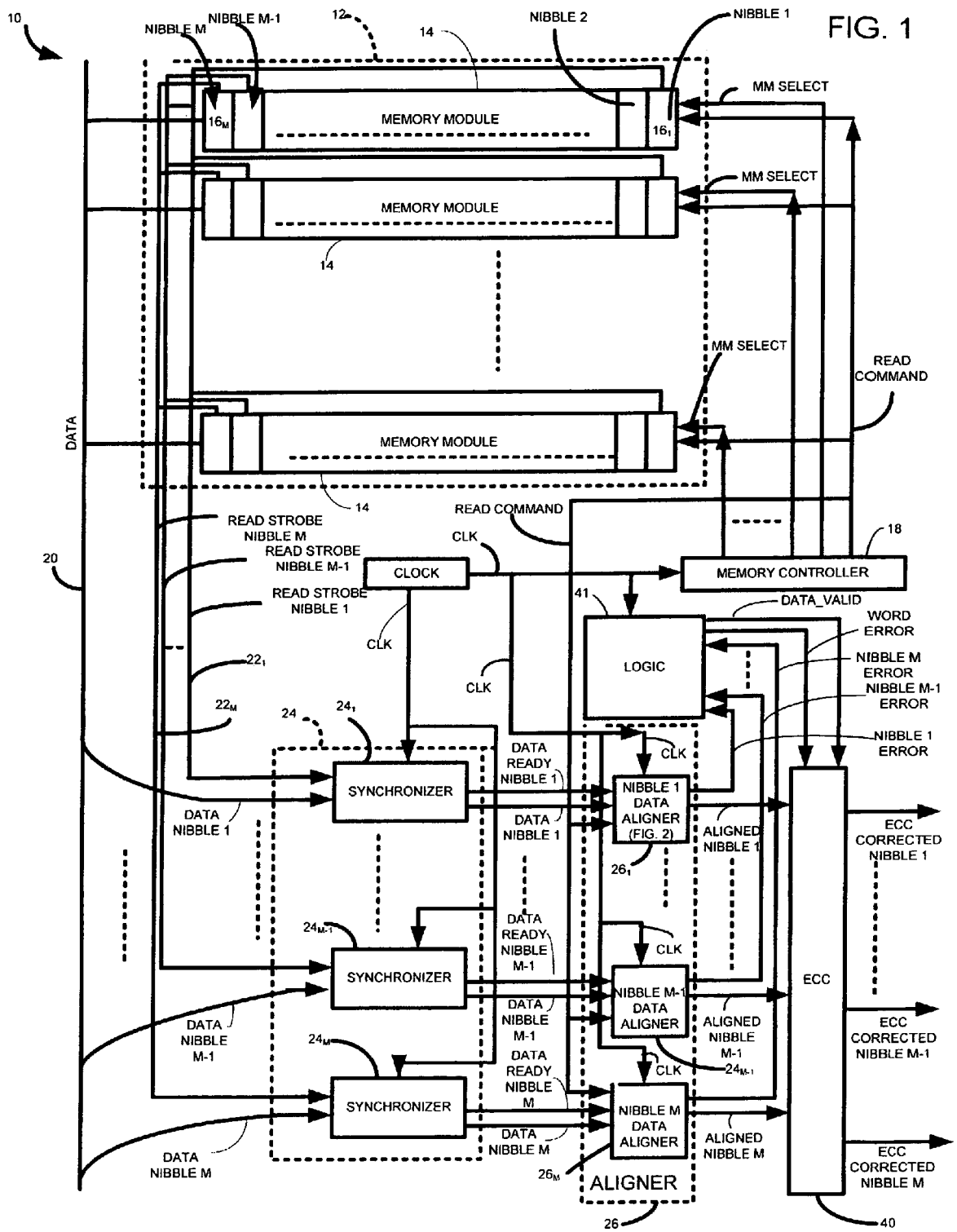
FIG. 1 is a block diagram of a memory system according to the invention.

Referring now to FIG. 1 a memory system 10, here a DDR (double Data Rate) memory system is shown having a memory section 12. The memory section 12 includes a plurality of, memory modules 14. Each one of the memory modules 14 includes a plurality of, here M, chips $16_1$-$16_M$. Here, each one of the memory modules 14 is a double data rate (DDR) random access memory (RAM). Each one of the chips $16_1$-$16_M$ stores a corresponding one of a plurality of nibbles of a word stored in such memory module 14, such nibbles also have an error correction and detection code. More particularly, each chips $16_1$-$16_M$ stores 4 bits (i.e., a nibble) of the word. Thus, here, M=20 bits, $B_1$-$B_{64}$ of the digital word are stored in chips $16_1$-$16_{16}$ and the chips $16_{17}$-$16_{20}$ store redundant bits $B_{65}$-$B_{80}$.

The system 10 includes a conventional memory controller 18 for producing, a write or a read command, (WC, RC, respectively, a read/write enable (W/R) memory module, in any conventional manner. Thus, in response to a write command, the memory controller 18 produces a write enable signal, the memory section 12 stores the digital word on the data bus 20 to the one of the memory modules 14 identified by address and memory module chip enable signals. The data on the data bus 20 is stored in response to write strobe pulses also fed to the memory modules in a conventional manner. As noted above, the data on the data bus includes not only the data but also redundant bits for error detection and correction.

In response to a read command, the memory controller 18 operates in response to system clock pulses CLK, for producing a read enable signal and memory module select signal to the plurality of memory modules 12 to thereby select for reading the word stored in a selected one of the memory modules 12. Thus, in response to the read command and the memory modules select signal, each of the M nibbles of a selected one of the memory modules 14 appear on the data bus 20 and along with an associated one of M read strobe signals on lines $22_1$-$22_M$, respectively. More particularly, as each read nibble is produced on the data bus 20 from a corresponding one of the M chips $16_1$-$16_M$, an associated read strobe appears on lines $22_1$-$22_M$, respectively.

The memory system 10 includes a synchronizer section 24 having a plurality of, M, synchronizers $24_1$-$24_M$. Each one of the synchronizers $24_1$-$24_M$ is fed a corresponding one of the M nibbles in chips $16_1$-$16_M$ and a corresponding one of the M read strobes appears on lines $22_1$-$22_M$, respectively. Thus, each one of the synchronizers $24_1$-$24_M$ is fed a corresponding one of the M nibbles read from chips $16_1$-$16_M$, respectively.

The synchronizer section 24 is responsive to the nibbles read from the selected one of the memory modules 14 and an associated read strobe signal produced by each one of the read nibbles. The synchronizer 24 is used to synchronize the read nibbles and the associated read strobes to the system clock pulses CLK in any conventional manner. Here, for example, the synchronizer section 24 includes portions of a DDR2 PHY, described in "0.11μ DDR2 PHY, November 2004, Technical Review Draft Nov. 18, 2004, TECHNICAL MANUAL" Copyright © 2004 by LSI Logic Corporation. The synchronizer section 24 receives read data from the selected one of the memory modules 14 and resynchronizes the data (i.e., the M nibbles and read strobes) from the asynchronous data strobe domain to the synchronous memory controller domain; i.e., the memory controller 18 domain. That is, it is desirable to synchronize the asynchronous read strobe and read nibbles with the system clock, CLK. The synchronizer section 24, however, can result in the read nibbles and read strobes becoming skewed one CLK relative to the other by X system clock pulses. One nibble may become skewed with respect to another nibble by X system clock pulses. The number X is provided by the manufacturer of the synchronizer 24 and is typically, and herein assumed, 1, i.e., here X is one system clock pulse, CLK.

The memory system 10 includes a data aligner 26 having a plurality of sections $26_1$-$26_M$, each one of the sections $26_1$-$26_M$ being fed by a corresponding one of the synchronized nibble and is associated synchronized read strobe (herein sometimes referred to herein as a data ready signal). An exemplary one of the sections $26_1$-$26_M$, here section $26_1$ is shown in more detail in FIG. 2. The memory system 10 includes a logic 41 fed by NIBBLE ERROR signals, to be described, from each one of the sections $26_1$-$26_M$. Suffice it to say here, however, that the aligner 26 includes an expected read strobe window detection section 35, to be described in connection with FIG. 2, responsive to the clock pulses and a read command for producing a time window representative of a time duration during which each of the read strobes is expected. The detection system 35 (FIG. 2) is also responsive to each one of the read strobes, which after synchronization is sometimes referred to herein as a "data ready nibble" signal, and the produced time window for producing, for one of the synchronized read strobes, a corresponding one of a plurality of NIBBLE ERROR signals. Each one of the NIBBLE ERROR signals indicates whether the corresponding one of the synchronized read strobes is within the produced window or is absent from such window. The logic 41 produces a logic 0 (i.e., no error, or correctable error) if one or less of the NIBBLE ERROR lines from each one of the sections $26_1$-$26_M$ is a logic 1 to indicate to an Error Corrector and Detector (ECC) 40, an extended EDAC, that the data in the aligner 26 is correct or has a correctable error; otherwise logic 41 produces a logic 1 to indicate to the ECC 40 that the data in the aligner 26 has an uncorrectable error.

More particularly, logic 41 produces a logic 0 (i.e., no error, or correctable error signal) on a WORD ERROR line if one or less of the NIBBLE ERROR lines from each one of the sections $26_1$-$26_M$ is a logic 1. Thus, a logic 0 produced on a NIBBLE ERROR line indicates no error and a logic 1 produced on a NIBBLE ERROR line indicates an error. Consequently, if one or less of the NIBBLE ERROR lines is a logic 1, such indicates to the ECC 40 that the data in the aligner 26 is correct or has a correctable error; otherwise logic 41 produces a logic 1 to indicate to the ECC 40 that the data in the aligner 26 has an uncorrectable error.

The logic 41 also stores all the NIBBLE ERROR signals information in a memory element, not shown. Therefore the interfacing device or diagnostic software can later request such information for regular maintenance and statistical data gathering purposes. In addition, logic 41 sends one single DATA_VALID signal to the ECC 40 to indicate to the ECC 40 that all data is present. This DATA_VALID signal is always sent to the ECC 40, regardless of the state of the individual synchronized read strobe signals. The timing of this signal depends on the timing of the individual read strobe signals, as described below in connection with FIG. 4. It is noted from FIG. 4 that depending on when the individual strobe signals arrive, the Data_valid will be asserted (i.e., logic 1) at different times. The Data_valid signal will be asserted when the last strobe arrives. Therefore, if all strobes arrive at CLK0, the Data_valid will be asserted at CLK0. If some or all strobes arrive at CLK1, then the Data_valid signal will be asserted at CLK1. If some or all strobes are missing, the Data_Valid asserted will be asserted at CLK1.

The ECC 40 responds to the WORD ERROR signal from logic 41, for correcting the word if the WORD ERROR signal is in a logic 0 (i.e. one or less of the NIBBLE ERROR lines from the align blocks 26 logic 1) and for indicating that the word has an uncorrectable error if the WORD ERROR signal from logic 41 is a logic 1 (i.e. more than one of the NIBBLE ERROR signals from the align block 26 is logic 1, indicating more then one synchronized read strobe signals are absent from the window).

Thus, referring to FIG. 2, an exemplary of the aligner sections $26_1$-$26_M$, here section $26_1$, is shown. Such section $26_1$ is responsive to the system clock pulses, CLK, the read command, and the data in nibble 1 (i.e., the nibble of data read from chip $16_1$ (FIG. 1), after passing through synchronizer section $24_1$ (i.e., the synchronized nibble 1), and the read strobe produced on line $22_1$ after passing through synchronizer section $24_1$, (i.e., the synchronized read strobe 1). The aligner 26 has X+1, here 2, system clock pulse CLK delays $20_1$, $20_2$, here flip/flops. Thus, the read nibble produced by synchronizer section $24_1$ is first stored in delay $30_1$ during one system clock pulse, CLK and is then stored in delay $30_2$. The outputs of the delays $30_1$, $30_2$, are fed to the 0 and 1 inputs, respectively, of a multiplexer (MUX) 32. A comparator 34 provides the control signal for the multiplexer 32. The aligner section $26_1$ includes an expected read strobe window generator 36. The expected read strobe window generator 36 is responsive to the system clock pulses CLK (FIG. 3A) and the read command (FIG. 3B) and produces a time window (FIG. 3C) representing the time period a read strobe signal from chip $16_1$ (after passing through synchronizer 24, (FIG. 1)) is expected. The data used to generate the initial time of the window is the result of a calibration process. The window (FIG. 3A) is here X+1 clock pulses CLK in duration to account for the skewing which takes place in the synchronizer section, as described above. Thus, the initial portion of the window occurs during a first one of the two clock pulses, CLK, here designated as CLK0, and the later portion of the window occurs during a second one of the two clock pulses, CLK, here designated as CLK1. The window (FIG. 3A) and the read strobe (FIG. 3B) produced by chip $16_1$ are fed to the comparator 34, as indicated in FIG. 2. Thus, the read strobe, if there is a valid read strobe, will be captured during either CLK 0 or CLK 1. If the read strobe is in the initial portion of the time window, i.e., the read nibble is available during the expected clock pulse CLK0, the comparator 34 produces a logic 0 and the nibble in delay $30_1$ is passed through the multiplexer 32. If the read strobe is in the later portion of the time window, i.e., the read nibble is available during the expected clock pulse CLK1, the comparator 34 produces a logic 1 and the nibble in delay $30_2$ is passed through the multiplexer 32. If the read strobe is within the window, the comparator 34 also produces a logic 0 ERROR signal; otherwise, if comparator will produce a logic 1 ERROR signal. Thus, the expected read available window generator 36 and comparator 34 provide the expected read strobe window detection section 35. More particularly, reference is made to FIG. 4 where various scenarios are shown:

In this example, in response to read command CMD1, all M nibbles have their read strobes detected by comparator 34 (FIG. 2) during the initial portion of the window, i.e., during CLK 0. Hence all read nibbles are available after the CLK0. Thus, in this example: comparators 38 in each one of the nibble aligner sections $26_1$-$26_M$ produce a logic 0 for multiplexer (MUX) 32 in each one of the nibble aligner sections $26_1$-$26_M$ and comparators 38 in each one of the nibble aligner sections $26_1$-$26_M$ produce a logic 0 on the NIBBLE ERROR line for the logic 41 in the aligner 26. Thus, the logic 41 produces a logic 0 for the WORD ERROR signal for the ECC 40, indicating that the data (i.e., the M nibbles) to the ECC 40 is correctable if there is an error in a nibble, and also indicates to the ECC 40, by asserting (i.e., producing a logic 1) on the DATA_VALID signal to latch the incoming data in a memory element (not shown) in the ECC 40. In this example the DATA_VALID signal will be logic 1 on CLK0, to indicate to the ECC block 40 that all data nibbles are valid in CLK0

In the next example, in response to read command CMD2, some nibbles have their read strobes detected by comparator 34 (FIG. 2) during the initial portion of the window, i.e., during CLK 0 and others have their read strobes detected by comparator 34 (FIG. 2) during the later portion of the window, i.e., during CLK 1. Hence, some read data is available after the CLK0 and others are available during CLK 1. The delays $30_1$, $30_2$, align all nibbles as indicated in FIG. 4, and a logic 0 is produced as the ERROR signal. Thus, in this example, the logic 41 produces a logic 0 (i.e., WORD ERROR) for the ECC 40, indicating that the data (i.e., the M nibbles) to the ECC 40 is correctable if there is an error in a nibble, and also indicates to the ECC 40 that each one of the nibbles is received within the expected time window. In this example the DATA_VALID signal will be logic 1 on CLK1, to indicate to the ECC 40 that all data nibbles are valid in CLK1.

In next example, in response to read command CMD3, all M nibbles have their read strobes detected by comparator 34 (FIG. 2) during the later portion of the window, i.e., during CLK 1. Hence all read data is available after the CLK1. Thus, in this example, the logic 41 produces a logic 0 (i.e., no WORD ERROR) for the ECC 40, indicating that the data (i.e., the M nibbles) to the ECC 40 is correctable if there is an error in a nibble, and also indicates to the ECC 40, and by asserting (i.e., producing a logic 1) the DATA_VALID signal, to latch the incoming data. In this example the DATA_VALID signal will be asserted on CLK1, to indicate to the ECC 40 that all data nibbles are valid in CLK 1.

In the next example, in response to read command CMD4, all M nibbles have their read strobes detected by comparator 34 (FIG. 2) during the initial portion of the window, i.e., during CLK 0 except the nibble in chip 162, not shown, indicated as nibble 2. Further, this nibble 2 is also missing during CLK1. Thus, in this example, a logic 1 ERROR signal is produced by the aligner section processing nibble 2. It is noted that the data is correctable by the ECC 40 because there is only one error. Therefore, the aligner transfers the data plus the logic 1 NIBBLE ERROR signal for nibble 2, logic 0 for all other NIBBLE ERROR signals and a logic 0 (i.e. no WORD ERROR) by logic 41, to the ECC 40. The NIBBLE ERROR signal of logic 1 for nibble 2 is stored in a register in logic 41, to later be read by the requesting device (or Software). Since only one data nibble 2 to the ECC 40 is incorrect. The ECC 40 corrects the data, and sends status information (of a correctable event) to the data-requesting device, not shown, along with the corrected data. Thus, an interfacing device such as a service monitor diagnostics software, not shown, can read logic 41 to determine which synchronized read strobe signal was missing. Thus, although the ECC 40 can correct for a single error, an indication of an error in a particular chip is stored in the memory element, if desired, in logic 41 and can be read by the requesting device and diagnostic software. Note also that in this example the WORD ERROR signal from logic 41 to ECC 40 is at logical value 0 (i.e. no error), and that the DATA_VALID signal is asserted on CLK1.

In the next example, in response to read command CMD5, all M nibbles have their read strobes detected by comparator 34 (FIG. 2) during the later portion of the window, i.e., during CLK 1 except the nibble in chip 162, not shown, indicated as nibble 2. Further, this nibble 2 is also missing during both CLK0 and CLK1. Thus, in this example, a logic 1 ERROR signal is produced by the aligner section processing nibble 2. It is noted that the data is correctable by the ECC 40 because there is only one error. Therefore, the aligner transfers the data plus the logic 1 NIBBLE ERROR signal for nibble 2, logic 0 for all other NIBBLE ERROR signals. Logic 41 sends a logic 0 on a WORD ERROR signal (i.e. no ERROR) to the ECC 40. The NIBBLE ERROR signal of logic 1 for nibble 2 is stored in the memory element, not shown, in logic 41, to later be read by the interfacing device or diagnostics software, not shown. Since only one data nibble 2 to the ECC 40 is incorrect. Thus, the ECC 40 corrects the data, and sends status information (of a correctable event) to the data-requesting device, not shown, along with the corrected data. The diagnostics software can determine from logic 41 which synchronized read strobe signal was missing. Thus, although the ECC 40 can correct for a single error, an indication of an error in a particular chip is stored and can be read by the requesting device and diagnostic software. Note also that in this example the WORD ERROR signal from logic 41 to ECC 40 is at logical value 0 (i.e. no error), and that the DATA_VALID signal is asserted (i.e., logic 1) on CLK1.

In the next example, in response to read command CMD6, some M nibbles have their read strobes detected by comparator 34 (FIG. 2) during the early portion of the window, i.e., during CLK0, others during the later portion of the window, i.e., during CLK 1 while both nibble 2 and another nibble, here nibble 6, are missing from the entire window. That is both nibble 2 and nibble 6 are missing during both CLK0 and CLK1. Thus, in this example, a logic 1 is produced by more than 1 aligner section. Thus, logic 41 produces a logic 1 WORD ERROR signal for ECC 40 indicating that the data has an uncorrectable error. It also asserts (i.e., produces a logic 1) the DATA_VALID signal on CLK1.

A number of embodiments of the invention have been described. Nevertheless, it will be understood that various modifications may be made without departing from the spirit and scope of the invention. Accordingly, other embodiments are within the scope of the following claims.

What is claimed is:

1. A memory system, comprising:
   a memory having a plurality of memory modules, each one of the memory modules having a plurality of memory chips, each one of the chips storing a corresponding one of a plurality of nibbles of a word stored in such memory module, such nibbles having an error correction and detection code;
   a memory controller operating in response to clock pulses, for producing a read command and memory module select signal to the plurality of memory modules to thereby select for reading from the memory, the nibbles of a selected one of the memory modules;
   an expected read strobe window detection section, responsive to the clock pulses and the read command for producing a time window representative of a time duration during which each one of a plurality of read strobes associated with a corresponding one of the memory chips is expected and is responsive to each one of the read strobes and the produced time window for producing, for one of the read strobes, a corresponding one of a plurality of NIBBLE ERROR signals, each one of the NIBBLE ERROR signals indicating whether the corresponding one of the read strobes is within the produced window or is absent from such window; and
   an error corrector and detector, response to each one of the produced NIBBLE ERROR signals, for correcting the word if only one of the NIBBLE ERROR signals indicates the read strobe is absent from the window and for indicating that the word has an error if more than one of the NIBBLE ERROR signals indicates the read strobe are absent from the window.

2. A memory system, comprising:
   a memory having a plurality of memory modules, each one of the memory modules having a plurality of memory chips, each one of the chips storing a corresponding one of a plurality of nibbles of a word stored in such memory module, such nibbles having an error correction and detection code;
   a memory controller operating in response to clock pulses, for producing a read command and memory module select signal to the plurality of memory modules to thereby select for reading from, the memory the nibbles of a selected one of the memory modules;
   a synchronizer, responsive to the nibbles read from the selected on of the memory modules and an associated read strobe signal produced by each one of the read nibbles and for synchronizing the read nibbles and the associated read strobes to the clock pulses;
   an expected read strobe window detection section, responsive to the clock pulses and the read command for producing a time window representative of a time duration during which each of the read strobes is expected and is responsive to each one of the read strobes and the produced time window for producing, for one of the synchronized read strobes, a corresponding one of a plurality of NIBBLE ERROR signals, each one of the NIBBLE ERROR signals indicating whether the corresponding one of the read strobes is within the produced window or is absent from such window; and an error corrector and detector, response to each one of the produced NIBBLE ERROR signals, for correcting the word if only one of the NIBBLE ERROR signals indicates the read strobe is absent from the window and for indicating that the word has an error if more than one of the NIBBLE ERROR signals indicates the read strobe are absent from the window.

3. The system recited in claim 2 wherein the window comprises a time duration comprising a plurality of clock pulses and wherein the system comprises a nibble aligner having a plurality of sections each one being fed by a corresponding one of ten synchronized nibbles, each one of the sections having a plurality of time delays, each one of the time delays comprising a period of one of the clock pulses and wherein the aligner includes a detectors for determining which one of the delays in the window has the synchronized nibble, wherein the aligner aligns the plurality of nibbles to a common time period.

* * * * *